(12) United States Patent
Huh et al.

(10) Patent No.: US 6,307,216 B1
(45) Date of Patent: Oct. 23, 2001

(54) THIN FILM TRANSISTOR PANELS FOR LIQUID CRYSTAL DISPLAYS

(75) Inventors: Sung-Wook Huh; Mun-Pyo Hong; Jang-Soo Kim; Bum-Ki Baek, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/533,379

(22) Filed: Mar. 22, 2000

(30) Foreign Application Priority Data

Mar. 24, 1999 (KR) .................................. 99-10037

(51) Int. Cl.[7] .......................... H01L 29/04; H01L 31/20; H01L 31/036; H01L 31/0376
(52) U.S. Cl. ................. 257/59; 257/72; 257/350
(58) Field of Search .................. 257/59, 72, 350

(56) References Cited

U.S. PATENT DOCUMENTS 5,303,074 * 4/1994 Salisbury ................................. 359/59
5,734,450 * 3/1998 Irie et al. ................................. 349/39
5,856,854 * 1/1999 Hyun ..................................... 349/43

* cited by examiner

*Primary Examiner*—Ngân V. Ngô
(74) *Attorney, Agent, or Firm*—Howrey Simon Arnold & White, LLP (57) ABSTRACT

Disclosed are ring-shaped gate wires and redundancy lines formed on a substrate so that defects due to disconnection of data lines can be readily repaired. The redundancy line is formed in a unit of a pixel, located outside the gate wire and divided into two portions. A gate insulating film is formed thereon, and data lines are formed thereon. Each of the data line overlaps the redundancy line and intersects a portion of the gate wire. A passivation film is formed on the data lines and transparent conductive connect patterns are formed thereon. The transparent connect pattern intersects two adjacent pixels and overlaps the ends of the redundancy lines facing each other. Since the end portions of the redundancy lines are bent out from the direction of the data line, it is not required that the connect pattern overlaps the data line. When the data line is disconnected on the step point where the data line intersects the gate wire, the redundancy lines can be short-circuited to the data line on either side of the disconnection point by using a laser to repair the disconnection.

21 Claims, 10 Drawing Sheets

THIN FILM TRANSISTOR PANELS FOR LIQUID CRYSTAL DISPLAYS

BACKGROUND OF THE INVENTION (a) Field of the Invention

The present invention relates to thin film transistor panels for liquid crystal displays (LCDs), more in detail, to wire structures for repairing defects due to disconnection of data lines.

(b) Description of the Related Art

Generally, thin film transistor liquid crystal displays include a plurality of gate lines transmitting scan signals, a plurality of data lines transmitting display signals and intersecting the gate lines, a plurality of pixel regions defined by the intersecting of the gate lines and the data lines, and thin film transistors (TFTs) formed in the pixel regions. Such TFT-LCDs are formed by depositing a plurality of thin films, one at a time, and etching the same. However, the films may break open in specific areas, causing a disconnection of the portions of the films.

To prevent the disconnection, the data lines are either doubled at portions where they overlap the gate lines, or another metal layer is deposited and patterned either over or under the data lines, to form repair lines. This method is disclosed in the currently pending U.S. application, application Ser. No. 09/174,429, filed on Oct. 19, 1999, entitled "LIQUID CRYSTAL DISPLAYS AND MANUFACTURING METHODS THEREOF" by Sang-Soo KIM, Dong-Gyu KIM and Woon-Yong, PARK. This pending application is hereby incorporated by reference.

In the former method above, it is difficult to repair the data lines disconnected in areas other than where the data lines intersect the gate lines.

In the latter method above, an additional metal layer is deposited and patterned to form the redundancy lines, and an insulating film is etched to form contact holes for connecting the redundancy lines and the data lines. Therefore, additional steps are required.

SUMMARY OF THE INVENTION

The present invention has been made in an effort to solve the above problems.

It is an object of the present invention to provide a redundancy line structure used to effectively repair disconnection defects of the data lines.

It is another object of the present invention to provide a redundancy line structure formed without introducing additional steps.

It is another object of the present invention to provide a redundancy line structure preventing short-circuited defects between the upper substrate and the lower substrate and the same between adjacent pixels.

To achieve the above objects, each redundancy line formed in every pixel and located under the data line is connected to a connect pattern located outside the data line so a short-circuited defect between the connect pattern and the upper substrate can be repaired.

In a thin film transistor panel for liquid crystal displays according to the embodiment of the present invention, a plurality of gate lines are formed on a substrate and arranged in a first direction. A plurality of data lines are located between adjacent gate lines and arranged in a second direction. A gate insulating film covers the gate lines and the redundancy lines. Data lines are formed thereon, arranged in the second direction and intersect the repair lines. A passivation film covers the data lines. Conductive connect patterns are formed thereon. The conductive connect pattern does not overlap the data line but is located outside the data line. The conductive connect pattern electrically couples the two redundancy lines located opposite each other with respect to the gate line.

The redundancy line may be divided into a first redundancy line and a second redundancy line that are respectively connected to the conductive connect pattern, and the third redundancy line separated from and located between the first and the second redundancy lines. It is preferable that portions of the first and the second redundancy lines that are connected to the conductive connect pattern are slanted outward from the data line. The conductive connect pattern may be made of the same material as the pixel electrode.

Furthermore, the redundancy line may be divided into the first redundancy line and the second redundancy line that are respectively connected to the conductive connect patterns. It is preferable that portions of the first and the second redundancy lines that are connected to the conductive connect pattern are bent outward from the data line.

It is preferable to make the redundancy line of the same material as the gate line.

A secondary gate line that is parallel to the gate lines may be formed and located between the two adjacent gate lines, and connecting lines that couple the gate line and the secondary gate line may be formed.

Additionally, a thin film transistor panel for liquid crystal displays according to another embodiment of the present invention includes redundancy lines formed and respectively located in every pixel, and conductive connect patterns respectively coupling any end of the redundancy line and the data line.

Both ends of the redundancy line are preferably bent outward from the data line, and the conductive connect pattern may be made of the same material as the pixel electrode.

A secondary gate line that is parallel to the gate lines, formed and located between the adjacent gate lines, and connecting lines that couple the gate line and the secondary gate line may be formed.

Redundancy lines are respectively formed in every pixel and divided into two portions in at least one pixel out of every several pixels, or preferably in one pixel out of every 2–10 pixels.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present.

A thin film transistor panel for liquid crystal displays (LCDs) according to the embodiments of the present invention will now be described hereinafter.

Figure 1:
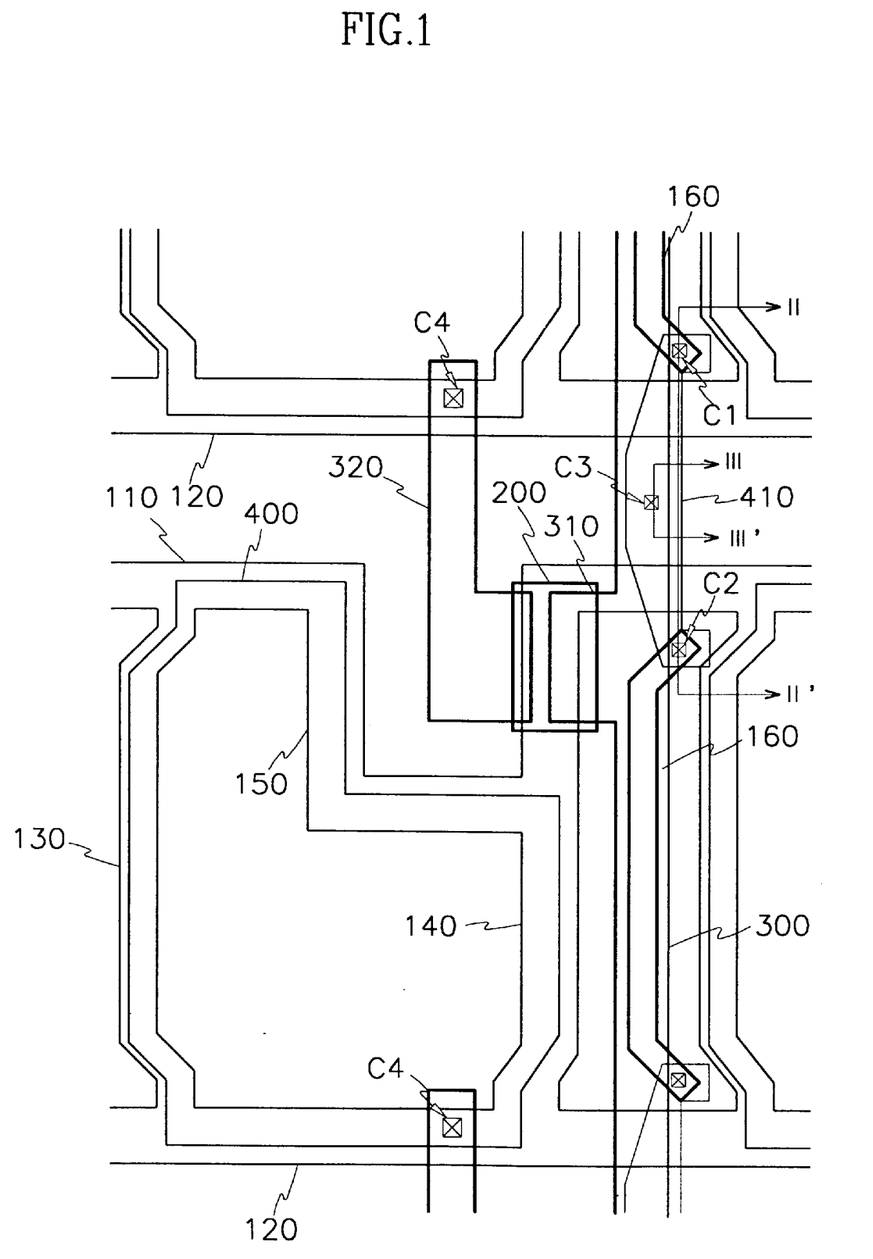
FIG. 1 is a layout view of a thin film transistor panel for a liquid crystal display according to a first embodiment of the present invention.
Figure 2:
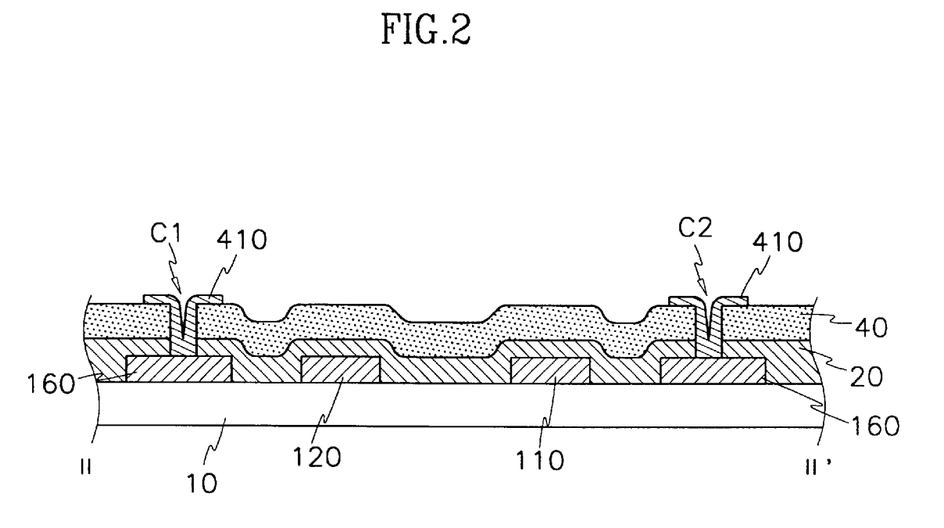
FIG. 2 and FIG. 3 are cross-sectional views taken along lines II–II' and III–III' of FIG. 1.
Figure 3:
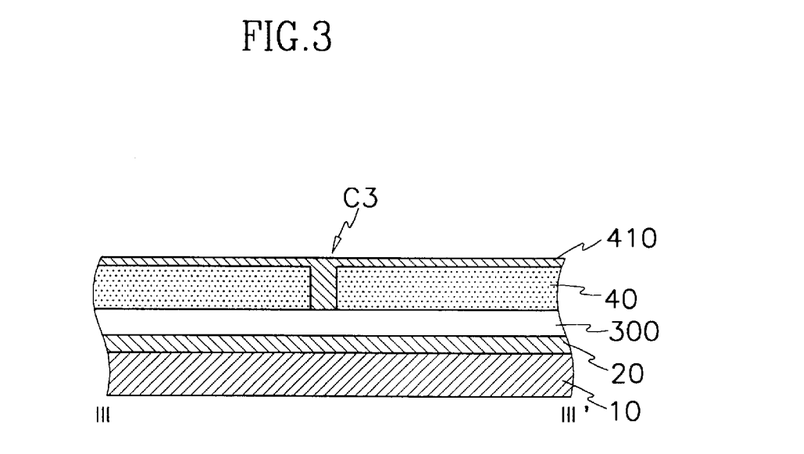

FIG. 1 is a layout view of a thin film transistor panel for LCDs having data redundancy lines according to a first embodiment of the present invention. FIG. 2 and FIG. 3 are cross-sectional views taken along lines II–II' and III–III' of FIG. 1, respectively. As shown in the drawings, the redundancy lines are formed using metal compatible with the gate lines, and are provided under a data line up to where the data line intersects a gate line. The redundancy lines located opposite each other with respect to the gate line are connected to the data line by an ITO (indium-tin-oxide) connect pattern.

As shown in FIGS. 1 to 3, an upper gate line 110 and a lower gate line 120 that are respectively formed on an upper side of a pixel and a lower side of the pixel are arranged in the horizontal direction. The upper gate line 110 and the lower gate line 120 are connected to each other by gate connecting lines 130 and 140 arranged in the vertical direction. In other words, a gate wire including the gate lines 110 and 120 and the gate connecting lines 130 and 140 has a ring-shaped pattern. To obtain an enough space to form a thin film transistor, the right upper portion 150 of the ring-shaped wire has a first portion bent downward from the gate line 110 and a second portion horizontally extended from the first portion and connected to the right gate connecting line 140.

Between the right gate connecting line 140 of the pixel and the left connecting line 130 of the next pixel, that is, between the pixel rows, redundancy lines 160 are formed and arranged in the vertical direction. The redundancy lines 160 are electrically separated from the gate wire and located between the upper gate line 110 and the lower gate line 120. Moreover, the both ends of the redundancy line 160 are bent outward from the vertical direction with a predetermined angle.

A gate insulating film 20 covers the ring-shaped gate wire and the redundancy lines 160, and a semiconductor layer 200 is formed thereon and located over the upper side of the right gate connecting line 140. Data lines 300 are formed on the gate insulating film 20, arranged in the vertical direction and overlap the redundancy lines 160. A source electrode 310 is extended from the data line 300 and overlaps the semiconductor layer 200. A drain electrode 320 are located opposite the source electrode 310 with respect to the right gate connecting line 140 and the end of the drain electrode overlaps the semiconductor layer 200. The other end of the drain electrode 320 is extended toward the previous pixel. Even though not shown in FIGS. 1 to 3, an ohmic contact layer is interposed between the data wire 300, 310 and 320 and the semiconductor layer 200.

A passivation film 40 covers the data wire and the semiconductor layer 200 and pixel electrodes 400 made of a transparent material such as ITO are formed thereon. The pixel electrode 400 is located in a pixel region surrounded by the ring-shaped gate wire 110, 120, 130, 140, and 150 and connected to the drain electrode 320 though a contact hole C4 formed in the passivation film 40.

Moreover, transparent conductive connect patterns 410 are formed on the passivation film 40 and made of the same material as the pixel electrode 400. The transparent conductive connect pattern 410 is located through the two adjacent pixels and overlaps the end of the redundancy line 160 of one pixel, the end of the redundancy line 160 of the other pixel and the data line 300. The conductive connect pattern 410 is connected to the overlapping portion of the redundancy lines 160 through contact holes C1 and C2 formed in the gate insulating film 20 and the passivation film 30, to the overlapping portion of the data line 300 through a contact hole C3.

In this first embodiment, as described above, since the conductive connect patterns 410 are formed on the intersecting portions where the upper and the lower gate lines 110 and 120 intersect the data line 300 and layers break open easily. Therefore, display signals can transmit through the conductive connect pattern 410 even when the data line 300 is disconnected in the intersecting portions.

As a result, defects due to the data line disconnection can be eliminated.

The first embodiment may be applicable to a structure having a single gate line in a pixel as well as the structure having a ring-shaped gate wire.

Next, a second embodiment of the present invention suggests an improved structure that reduces defects of short-circuits between the ITO film and the common electrode of an upper substrate due to conductive particles.

Figure 4:
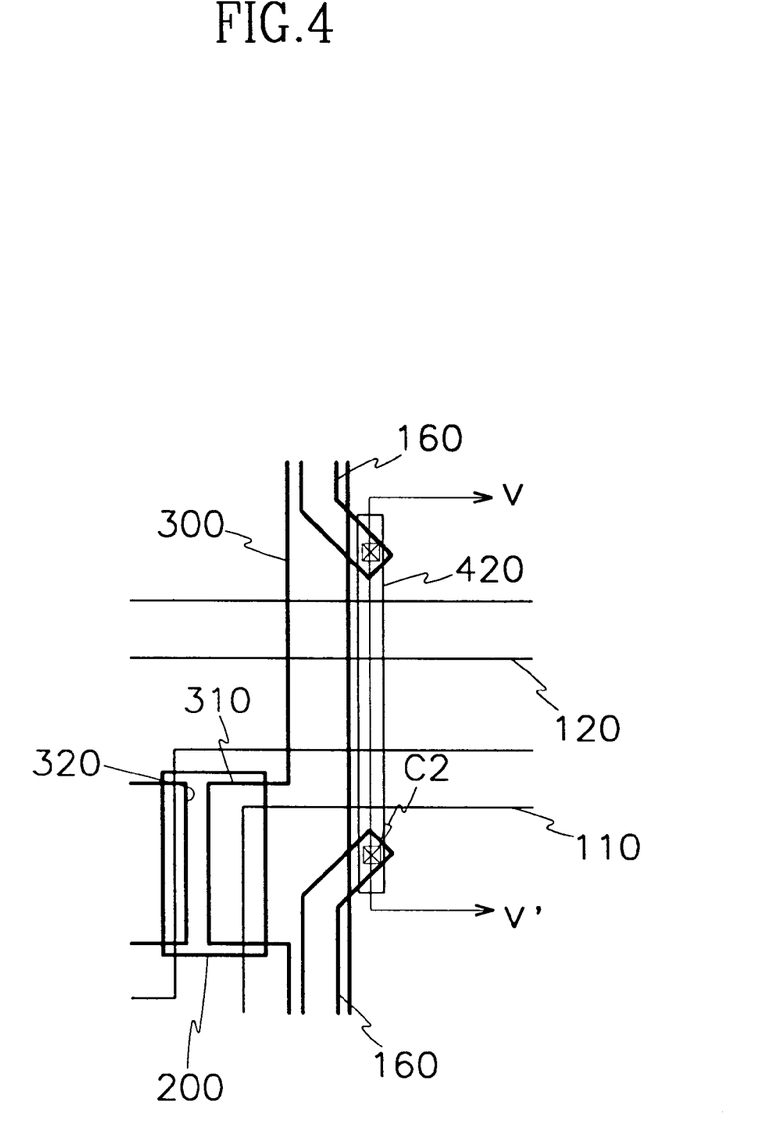
FIG. 4 is a layout view of a thin film transistor panel for a liquid crystal display according to a second embodiment of the present invention.
Figure 5:
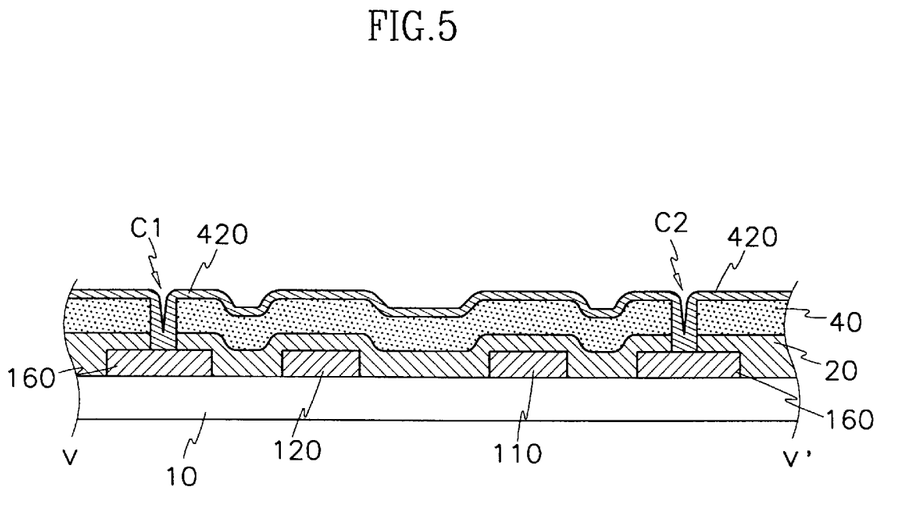
FIG. 5 is a cross-sectional view taken along line V–V' of FIG. 4.

FIG. 4 is a layout view of a thin film transistor panel for an LCD according to a second embodiment of the present invention, and FIG. 5 is a cross-sectional view taken along line V–V' of FIG. 4.

Like the embodiment described above, gate wires 110, 120, 130, and 140, semiconductor layers 200, data wires 300, 310, and 320, pixel electrodes 400, redundancy lines 160, and transparent conductive connect patterns 420 are formed. Therefore, display signals transmit through the conductive connect pattern 420 and the redundancy lines 160 connected to the conductive connect pattern 420 even when the data line 300 is disconnected.

Furthermore, as shown in FIGS. 4 and 5, the conductive connect pattern 420 does not overlap the data line 300 but is located outside it. In other words, the conductive connect pattern 420 lies on the gate insulating film 20 and the passivation film 40, or the gate insulating film 20, the passivation film 40 and the gate wire 110 and 120. Therefore, total film thickness of the structure according to this embodiment becomes thinner than that of the structure that locates the conductive connect pattern on the data line 300, and the short-circuited defects occurring between a transparent electrode of the upper substrate (not shown) and the conductive connect pattern 420 by conductive particles are reduced.

The second embodiment may be applicable to a structure having a single gate line in a pixel as well as the structure having a ring-shaped gate wire.

A third embodiment of the present invention now will be described with reference to FIG. 6, which solves the problem of data signal delay in the first and the second embodiments.

Figure 6:
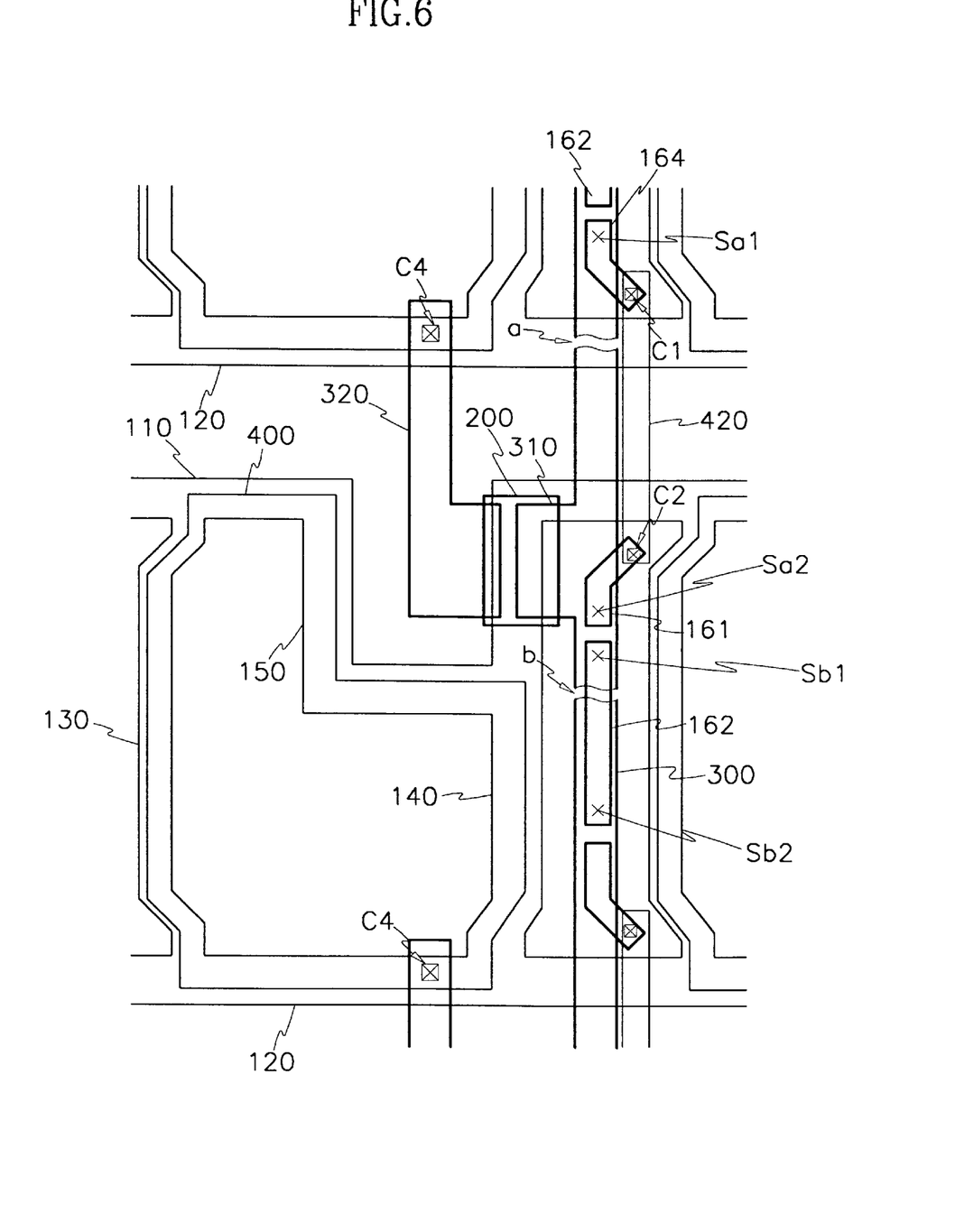
FIG. 6 is a layout view of a thin film transistor panel for a liquid crystal display according to a third embodiment of the present invention.

FIG. 6 is a layout view of a thin film transistor panel for an LCD according to a third embodiment of the present invention, schematically showing a state where a data line disconnection is repaired.

Like the embodiments described above, gate wires 110, 120, 130, and 140, semiconductor layers 200, data wires 300, 310, and 320, pixel electrodes 400, redundancy lines 161, 162 and 164, and transparent conductive connect patterns 420 are formed.

As shown in FIG. 6, redundancy lines have the same shape as those of the first and the second embodiments except that they are divided into three portions. In other words, the redundancy line includes a first redundancy line 161 and a third redundancy line 164, which are outer portions of the redundancy line, and a second redundancy line 162 located between the first and the third redundancy lines 161 and 164.

Moreover, the conductive connect pattern 420 is formed in the same manner as the embodiments described above. That is, the conductive connect pattern 420 is located through the two adjacent pixels, and overlaps one end of the redundancy line 164 of one pixel, the gate lines 120 and 110 and one end of the redundancy line 161 of the other pixel. The conductive connect pattern 420 is connected to the redundancy lines 164 and 161 through contact holes C1 and C2 formed in the passivation film 40 and the gate insulating film 20. In this embodiment, the conductive connect pattern 420 do not overlap the data line 300 but is located outside the data line 300.

Therefore, total film thickness of the structure according to this embodiment becomes thinner than that of the structure wherein the conductive connect pattern overlaps the data line 300. As a result, the short-circuited defects occurring between a transparent electrode of the upper substrate (not shown) and the conductive connect pattern 420 by conductive particles are remarkably reduced.

In addition, since the first redundancy line 161 and the third redundancy line 164 are separated from the second redundancy line 162 and do not connect to the data line 300, the short-circuited defects between the data line 300 and the pixel electrode 400 do not occur even though the conductive connect pattern 420 connected to the first redundancy line 161 and the third redundancy line 164 is shorted to the pixel electrode 400 of the next pixel.

In the wire structure according to the third embodiment, if the data line 300 is disconnected in a step region where the upper gate line 110 or the lower gate line 120 intersects the data line 300, the first and the third redundancy lines 161 and 164 are shorted (Sa2, Sa1) by using a laser to the data line 300 on either side of the disconnection point (a) by using a laser to transmit display signals to an opposite portion with respect to the disconnection point (a) through the conductive connect pattern 420. In the case the data line 300 is disconnected in regions beyond the step region, the second redundancy line 162 is shorted (Sb1, Sb2) to the data line 300 on either side of the disconnection point (b) by using a laser to make the second redundancy line 162a path for the signals.

In the third embodiment, since it is possible to repair the disconnection defects occurring in the step region and other regions by selectively using the first, second and third redundancy lines 161, 162 and 164, the signal delays due to a coupling effect generated between the redundancy lines 161, 162 and 164 and the data line 300 may be prevented.

The third embodiment may be applicable to a structure having a single gate line in a pixel as well as the structure having a ring-shaped gate wire.

Next, a fourth embodiment will be described with reference to FIG. 7, which shows a structure having an advantage in the laser shorting steps.

Figure 7:
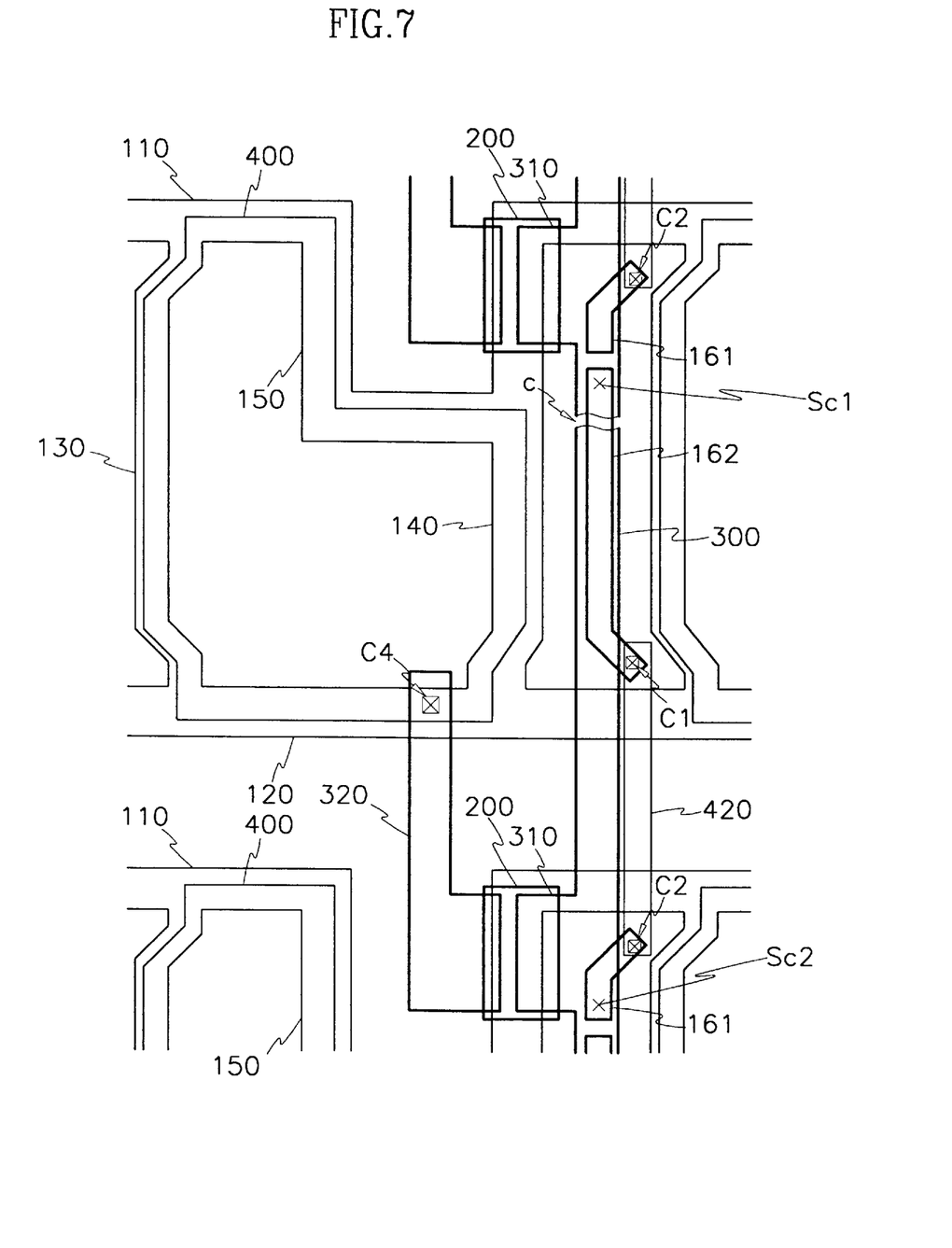
FIG. 7 is a layout view of a thin film transistor panel for a liquid crystal display according to a fourth embodiment of the present invention.

FIG. 7 is a layout view of a thin film transistor panel for an LCD according to a fourth embodiment of the present invention and shows a repairment of the disconnected data line.

As shown in FIG. 7, gate wires 110, 120, 130, and 140, semiconductor layers 200, data wires 300, 310, and 320, pixel electrodes 400, transparent conductive connect patterns 420 and redundancy lines 161 and 162 that are similar with those in the second embodiment are formed.

However, the redundancy line having the same shape as in the first and the second embodiments is divided into two portions, one of which is a first redundancy line 161 and the other is a second redundancy line 162.

In the wire structure according to the fourth embodiment, if the data line 300 is disconnected in a step region where the upper gate line 110 or the lower gate line 120 intersects the data line 300 or in other regions, the first redundancy line 161 in the pixel and the second redundancy line 162 in the previous pixel are shorted (Sc1, Sc2) to the data line 300 on either side of the disconnection point (c) by using a laser to transmit display signals to an opposite portion with respect to the disconnection point (c) through the conductive connect pattern 420. Since the laser-shorting points (Sc1, Sc2) are any two points located opposite each other with respect to the disconnection point (c), the margin of error is increased in the laser repair process.

Furthermore, the structure of this embodiment prevents the transparent conductive connect pattern from short-circuiting to the transparent electrode of an upper substrate and has an advantage of decrease of display signal delays, compared to the first and the second embodiments.

The fourth embodiment described above may be applicable to a structure having a single gate line in a pixel as well as the structure having a ring-shaped gate wire.

A fifth embodiment now will be described hereinafter with reference to FIG. 8, which increases the margin for laser-repairing compared to the structure of the fourth embodiment.

Figure 8:
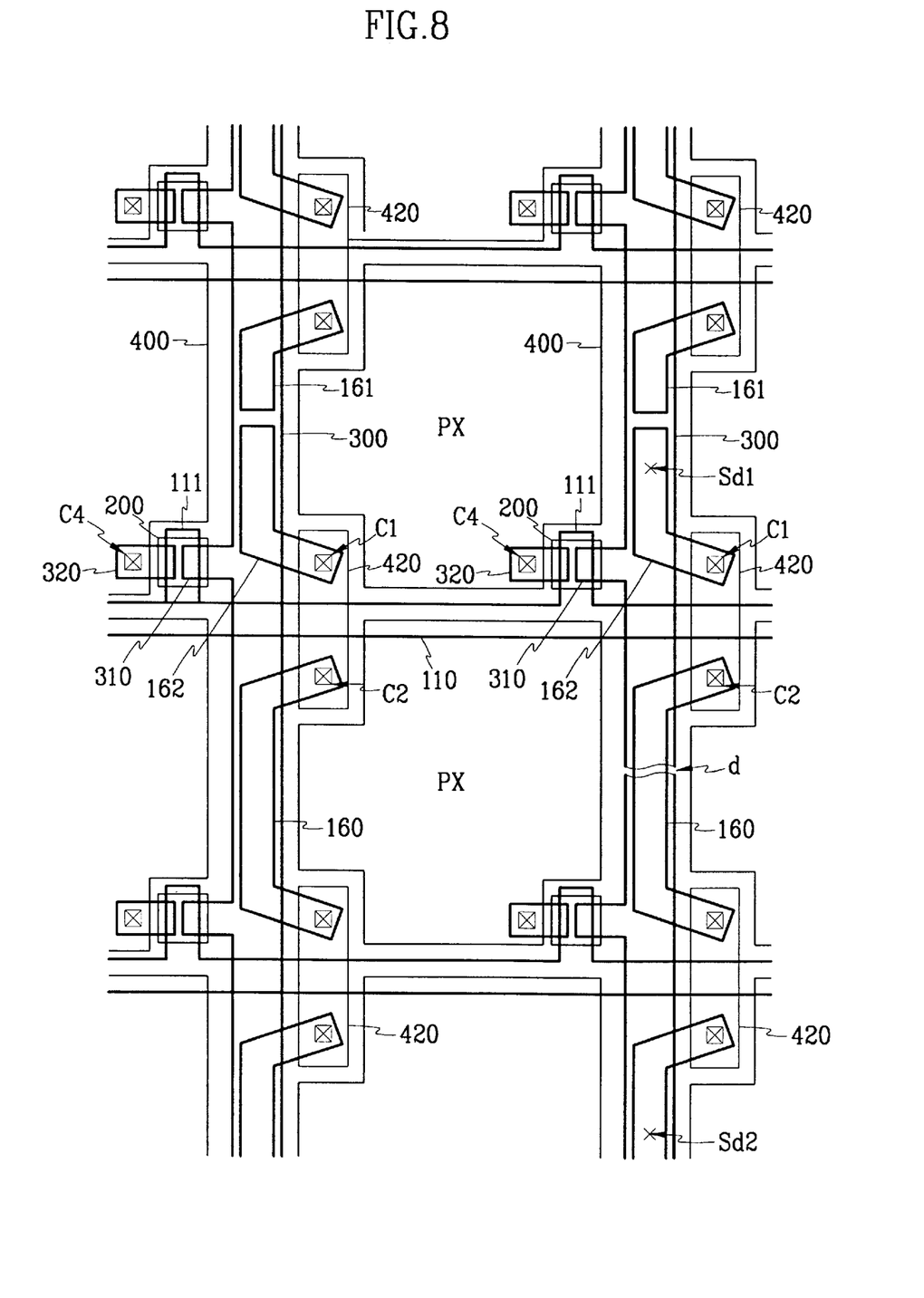
FIG. 8 is a layout view of a thin film transistor panel for a liquid crystal display according to a fifth embodiment of the present invention.

FIG. 8 is a layout view of a thin film transistor for an LCD according to a fifth embodiment of the present invention, where redundancy lines having the same shape as in the first and the second embodiments are respectively formed in every pixel and divided into two portions with respect to at least one pixel out of every several pixels. In addition, a structure having a single gate line in a pixel in FIG. 8 may be also applicable to a structure having a ring-shaped gate wire.

As shown in FIG. 8, a plurality of gate lines 110 are formed and arranged in parallel to each other. A plurality of data lines 300 intersect and are insulated from the gate lines 110. preferably, the data lines 300 are arranged perpendicular to the gate lines 110. A plurality of pixel regions PX are defined by intersecting the gate lines 110 and the data lines 300. In each pixel region PX, a thin film transistor including a gate electrode 111 extended from the gate line 110, a semiconductor layer 200 formed on and insulated from the gate electrode 111, a source electrode 310 extended from the data line 300 and overlaps an edge of the semiconductor layer 200, and a drain electrode 320 located opposite the source electrode 310 with respect to the semiconductor layer 200 and overlaps an edge of the semiconductor layer 200. Moreover, a pixel electrode 400 is formed in each pixel region PX and connected to the drain electrode 400 through the contact hole C4 formed in a passivation film. Redundancy lines 160, 161, and 162 are formed and have the shape similar to the embodiments described above. Like the previously-mentioned embodiment, the redundancy lines are made of the same material as the gate lines 110, located between the two adjacent gate lines 110, and overlap the data lines 300. Conductive connect patterns 420 are formed, arranged parallel to the data lines 300, located outside the data lines 300 and made of the same material as the pixel electrode 400. The conductive connect pattern 420 intersects the gate lines 110 across the two pixels and connects the ends of the redundancy lines 160 or 161 and 162.

However, in this fifth embodiment, a redundancy line per every 2–10 pixels in a row is respectively divided like the fourth embodiment into two portions of a first redundancy line 161 and a second redundancy line 162. In the rest of the pixels, non-divided redundancy lines 160 are arranged like the first and second embodiments. In other words, the conductive connect patterns 420 connects the redundancy lines 161, 162 and 160 per every 2–10 pixels.

Therefore, it is possible to perform a short circuit at any two points (Sd1, Sd2) within 2–10 pixels by a laser, if the two points are located opposite to each other with respect to the data line disconnection point (d). As a result, the margin for laser-repair is bigger and the repair time is shorter than those in the fourth embodiment. In addition, after the repair, display signal delays are remarkably reduced compared to the first and the second embodiments.

Moreover, it is possible to eliminate short circuits between the conductive connect pattern and a transparent electrode of an upper substrate.

Next, a wire structure according to a sixth embodiment of the present invention will be described with reference to FIGS. 9 and 10, where the laser-shorting process can be relatively reduced compared to the third, fourth and fifth embodiments.

Figure 9:
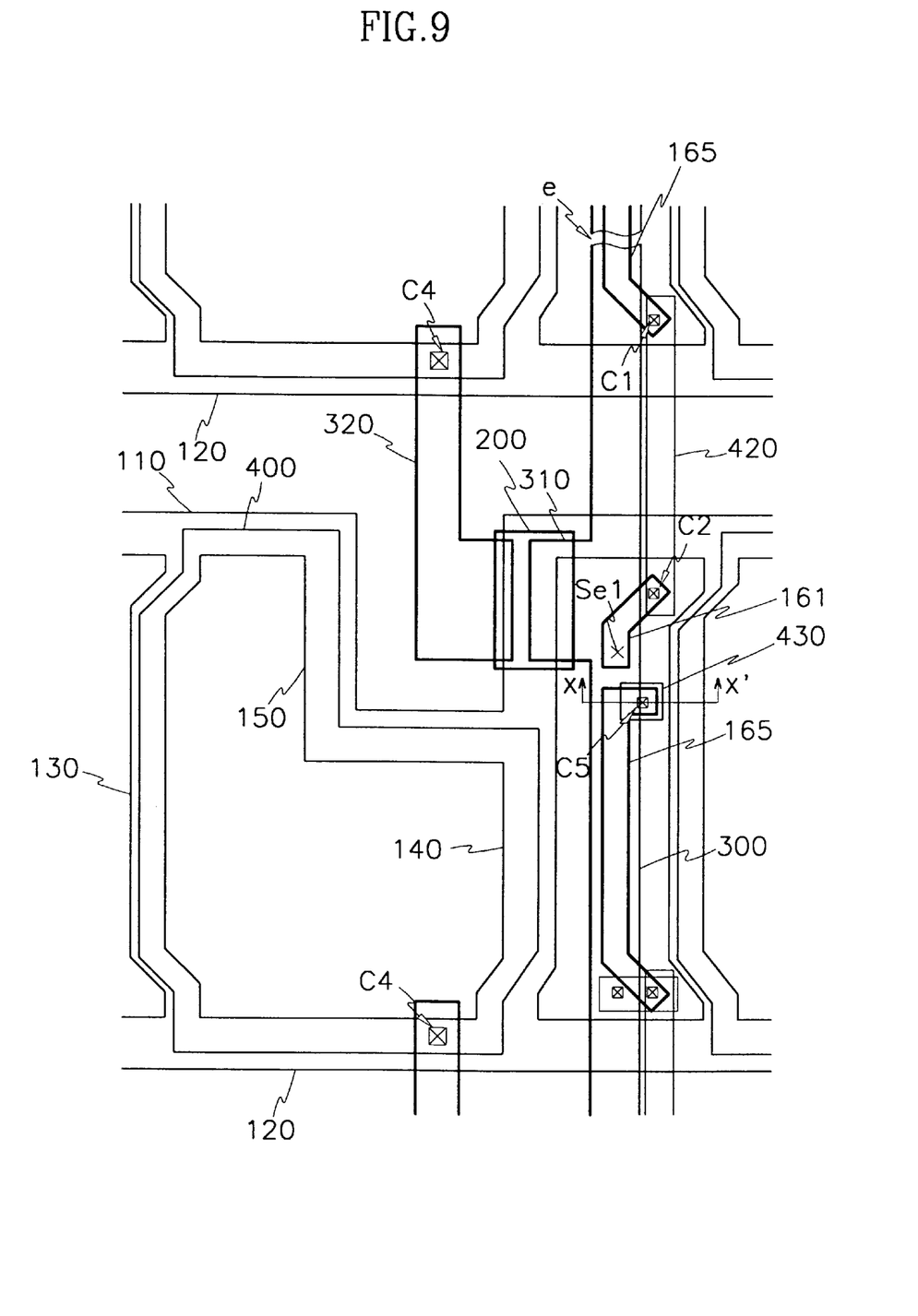
FIG. 9 is a layout view of a thin film transistor panel for a liquid crystal display according to a sixth embodiment of the present invention.
Figure 10:
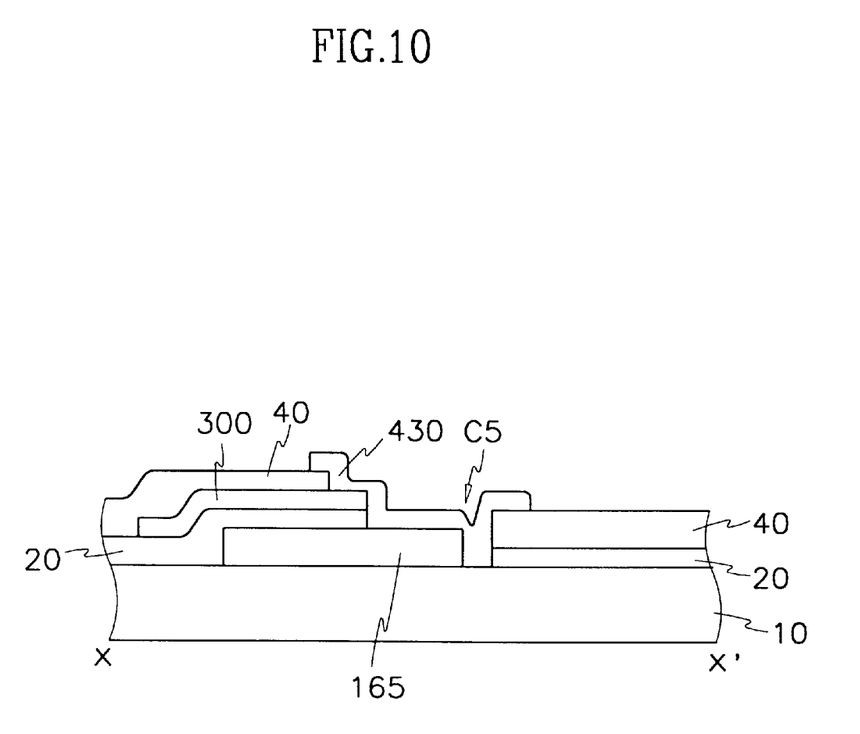
FIG. 10 is a cross-sectional view taken along line X–X' of FIG. 9.

FIG. 9 is a layout view of a thin film transistor panel for an LCD according to a sixth embodiment of the present invention, and FIG. 10 is a cross-sectional view taken along line X–X' of FIG. 9.

As shown in FIGS. 9 and 10, gate wires 110, 120, 130, and 140, semiconductor layers 200, data wires 300, 310, and 320, pixel electrodes 400, transparent conductive connect patterns 420, and redundancy lines each of which is divided into the first redundancy line 161 and the second redundancy line 165 as almost in the same way as those in the fourth embodiment.

However, ends of one of the first and the second redundancy lines 161 and 165 (i.e. in FIG. 9, the second redundancy line 165) are extended with a predetermined angle from the vertical direction. One end of the redundancy line 165 is connected to the conductive connect pattern 420 and the other end of the redundancy line 165 is connected to the data line 300 by a secondary connect pattern 430. As shown in FIG. 10, a contact hole C5 exposing the second redundancy line 165 and the data line 300 at the same time is formed in the gate insulating film 20 and the passivation film 40. The secondary connect pattern 430 made of the same material as the conductive connect pattern 420 couples the data line 300 and the second redundancy line 165 through the contact hole C5.

In the structure of this sixth embodiment, when a data line is disconnected at (e), only the first redundancy line 161 is short-circuited to the data line 300 by using a laser to repair the disconnection at (e) defect.

Therefore, the wire structure according to the sixth embodiment has an advantage of reducing the laser-shorting steps. In addition, the possibility of short circuits between the conductive connect pattern and a transparent electrode (not shown) of an upper substrate are remarkably reduced as in the embodiments mentioned above.

Even though not shown in FIG. 9, the redundancy line may be divided into three portions as in the third embodiment. The middle portion 163 of the three may be respectively connected to the data line 300 by connect means similar to the secondary connect patterns of the sixth embodiment.

Finally, a thin film transistor for an LCD according to a seventh embodiment of the present invention will be described with reference to FIG. 11.

Figure 11:
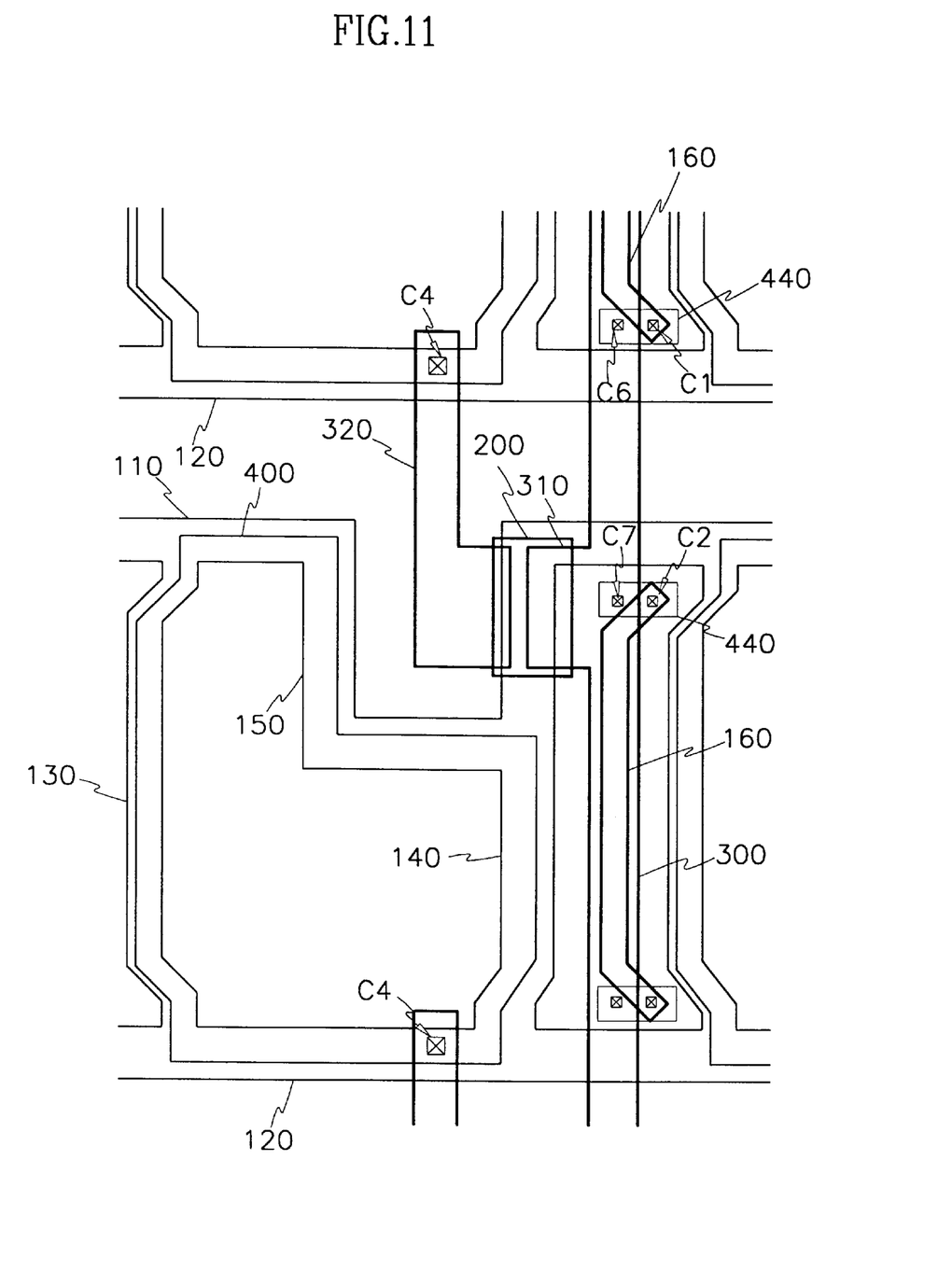
FIG. 11 is a layout view of a thin film transistor panel for a liquid crystal display according to a seventh embodiment of the present invention.

FIG. 11 is a layout view of a thin film transistor for an LCD according to a seventh embodiment of the present invention.

As shown in FIG. 11, gate wires 110, 120, 130, and 140, semiconductor layers 200, data wires 300, 310, and 320, pixel electrodes 400 and redundancy lines 160 like those in the first and the second embodiments are formed.

However, in this seventh embodiment, connect patterns 440 couple each of the two ends of redundancy line 160 and the data line 300 in a pixel, not intersecting the gate lines 110 and 120 through the two adjacent pixels. The connect pattern 440 couples the end of the redundancy line 160 and the data line 300 at the same time through contact holes C1 and C6 or C2 and C7 formed in a gate insulating film and a passivation film.

Unlikely the other embodiments described above, when the data line 300 is disconnected on an intersecting portion of the data line 300 and the gate line 110 or 120, there is a difficulty that a part of the ring-shaped gate wire 110, 120, 130, and 140 should be used for repairing the disconnection. However, when the data line 300 is disconnected in a pixel not on the intersecting portion, an additional laser-shorting step is not needed.

As described above, in thin film transistor panels for LCDs according to the present invention, the redundancy lines can be formed without additional steps. Moreover, it is possible to effectively repair the data line disconnection. Further benefits may include a decrease of the display signal delay, decrease of laser-shorting steps, and an enhancement of the margin for laser repair. In addition, it is possible to prevent short circuits between a lower substrate and an upper substrate.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A thin film transistor for a liquid crystal display comprising:

an insulating substrate;

a plurality of gate lines formed on the substrate and arranged parallel to each other;

a plurality of redundancy lines formed on the substrate, each of which being located between two adjacent gate lines;

a first insulating layer covering the gate lines and the redundancy lines;

data lines formed on the first insulating layer and intersecting the gate lines, each of which overlapping the redundancy line;

a second insulating layer covering the data lines; and conductive connect patterns formed on the second insulating layer and located outside the data lines not to overlap the data lines, each of which being electrically connected to the redundancy lines located opposite to each other with respect to the gate line.

2. A thin film transistor panel for a liquid crystal display according to claim 1, wherein the redundancy line is divided into a first redundancy line and a second redundancy line that are connected to the conductive connect patterns, and a third redundancy line located between the first redundancy line and the second redundancy line.

3. A thin film transistor panel for a liquid crystal display according to claim 2, wherein portions of the first redundancy line and the second redundancy line that are respectively connected to the conductive connect patterns are bent out from the direction of the data line.

4. A thin film transistor panel for a liquid crystal display according to claim 3, wherein the conductive connect pattern is made of indium-tin-oxide.

5. A thin film transistor panel for a liquid crystal display according to claim 1, wherein the redundancy line is divided into a first redundancy line and a second redundancy line that are respectively connected to the conductive connect patterns.

6. A thin film transistor panel for a liquid crystal display according to claim 5, wherein portions of the first redundancy line and the second redundancy line that are respectively connected to the conductive connect pattern are bent out from the direction of the data line.

7. A thin film transistor panel for a liquid crystal display according to claim 5, wherein the conductive connect pattern is made of indium-tin-oxide.

8. A thin film transistor panel for a liquid crystal display according to claim 1, further comprising:

a plurality of secondary gate lines each of which is located between the two adjacent gate lines and arranged parallel to the gate lines; and connecting lines that couple the gate line and the secondary line.

9. A thin film transistor panel for a liquid crystal display according to claim 1, wherein the redundancy line is made of the same material as the gate line.

10. A thin film transistor panel for a liquid crystal display comprising:

an insulating substrate;

a plurality of gate lines formed on the substrate and arranged parallel to each other;

a plurality of redundancy lines formed on the substrate, each of which being located between two adjacent gate lines;

a first insulating layer covering the gate lines and the redundancy lines;

data lines formed on the first insulating layer, intersecting the gate lines, each of which overlapping the redundancy line;

a second insulating layer covering the data lines;

first connect patterns formed on the second insulating layer, each of which coupling a first end of the redundancy line and the data line; and second connect patterns formed on the second insulating layer, each of which coupling a second end of the redundancy line and the data line.

11. A thin film transistor panel for a liquid crystal display according to claim 10, wherein the first end and the second end of the redundancy line are bent out from the direction of the data line.

12. A thin film transistor panel for a liquid crystal display according to claim 10, further comprising:

a plurality of secondary gate lines arranged parallel to the gate lines and each of which being located between two adjacent gate lines; and connecting lines coupling the gate line and the secondary gate line.

13. A thin film transistor panel for a liquid crystal display according to claim 10, wherein the first and the second connect patterns are made of ITO.

14. A thin film transistor panel for a liquid crystal display comprising:

a substrate;

a plurality of gate lines formed on the substrate and arranged parallel to each other;

a plurality of first redundancy lines formed on the substrate and separated from each other with respect to the gate line;

an insulating film formed on the gate lines and the first redundancy lines;

a plurality of data lines formed on the insulating film and intersecting the gate lines, each of which overlapping the first redundancy line;

a plurality of pixels defined by intersecting of the gate lines and the data lines;

a plurality of thin film transistors each of which being formed in the pixel;

a passivation film formed on the data lines and the thin film transistors;

pixel electrodes formed on the passivation film, each of which being electrically connected to a terminal of the thin film transistor; and a plurality of second redundancy lines, each of which electrically coupling the first two redundancy lines on either side of the gate line, wherein the first redundancy line is formed in every pixel.

15. A thin film transistor panel for a liquid crystal display according to claim 14, wherein the second redundancy lines are formed on the passivation film and each of the same is connected to the first redundancy lines through contact holes formed in the insulating film and the passivation film.

16. A thin film transistor panel for a liquid crystal display according to claim 14, wherein the first redundancy line located in at least one out of the plurality of pixels is divided into two portions.

17. A thin film transistor panel for a liquid crystal display according to claim 16, wherein the first redundancy line is made of the same material as the gate lines.

18. A thin film transistor panel for a liquid crystal display according to claim 16, wherein the second redundancy line is made of the same material as the pixel electrodes.

19. A thin film transistor panel for a liquid crystal display according to claim 16, where the first redundancy line located in one per every 2–10 pixels is divided into two portions.

20. A thin film transistor panel for a liquid crystal display according to claim 15, wherein the first redundancy line located in at least one out of the plurality of pixels is divided into two portions.

21. A thin film transistor panel for a liquid crystal display according to claim 20, where the first redundancy line located in one per every 2–10 pixels is divided into two portions.

* * * * *